United States Patent
Matsunaga et al.

(10) Patent No.: US 10,087,516 B2
(45) Date of Patent: Oct. 2, 2018

(54) EVAPORATION APPARATUS AND EVAPORATION METHOD

(71) Applicant: Sharp Kabushiki Kaisha, Sakai, Osaka (JP)

(72) Inventors: Kazuki Matsunaga, Sakai (JP); Katsuhiro Kikuchi, Sakai (JP); Shinichi Kawato, Sakai (JP); Takashi Ochi, Sakai (JP); Yuhki Kobayashi, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/314,980

(22) PCT Filed: Jun. 3, 2015

(86) PCT No.: PCT/JP2015/066018
§ 371 (c)(1),
(2) Date: Nov. 30, 2016

(87) PCT Pub. No.: WO2015/186732
PCT Pub. Date: Dec. 10, 2015

(65) Prior Publication Data
US 2017/0198387 A1     Jul. 13, 2017

(30) Foreign Application Priority Data
Jun. 3, 2014   (JP) ................. 2014-115103

(51) Int. Cl.
C23C 16/00     (2006.01)
C23C 14/24     (2006.01)
C23C 14/04     (2006.01)

(52) U.S. Cl.
CPC ............ *C23C 14/24* (2013.01); *C23C 14/042* (2013.01); *C23C 14/044* (2013.01)

(58) Field of Classification Search
CPC ............................ C23C 14/042; C23C 14/044
(Continued)

(56) References Cited

U.S. PATENT DOCUMENTS

2004/0216992 A1* 11/2004 Ando ................... C23C 14/225
                                                                      204/192.12
2007/0178708 A1    8/2007 Ukigaya
(Continued)

FOREIGN PATENT DOCUMENTS

JP        55-107777 A     8/1980
JP        02-73974 A      3/1990
(Continued)

OTHER PUBLICATIONS

Official Communication issued in International Patent Application No. PCT/JP2015/066018, dated Aug. 25, 2015.

*Primary Examiner* — Keath T Chen
(74) *Attorney, Agent, or Firm* — Keating & Bennett, LLP

(57) ABSTRACT

An evaporation apparatus includes: a substrate holding section configured to hold a substrate; an evaporation mask having an opening part at a position which is opposite to one surface of the substrate; an evaporation source configured to supply the one surface with evaporated particles via the opening part and to form a film of the evaporated particles on the one surface exposed from the opening part; and a film thickness correction means configured to block a portion of an ejection path of the evaporated particles from the evaporation source toward the opening part and configured to correct a thickness of the film by changing a position at which the ejection path is blocked over time.

8 Claims, 15 Drawing Sheets

(58) Field of Classification Search
USPC .......................................................... 118/504
See application file for complete search history.

(56) References Cited

U.S. PATENT DOCUMENTS

| | | | | |
|---|---|---|---|---|
| 2008/0199609 A1* | 8/2008 | Kuan | ................... | C23C 14/542 |
| | | | | 427/248.1 |
| 2009/0090301 A1* | 4/2009 | Tso | ........................ | C23C 14/50 |
| | | | | 118/715 |
| 2013/0017320 A1* | 1/2013 | Sonoda | ................ | C23C 14/042 |
| | | | | 427/66 |
| 2013/0228121 A1* | 9/2013 | Pei | ........................ | C23C 14/042 |
| | | | | 118/504 |

FOREIGN PATENT DOCUMENTS

| | | | |
|---|---|---|---|
| JP | 04-13871 A | | 1/1992 |
| JP | 2001-181837 A | | 7/2001 |
| JP | 2001181837 A | * | 7/2001 |
| JP | 2004-269988 A | | 9/2004 |
| JP | 2007-227359 A | | 9/2007 |
| WO | 2011/129043 A1 | | 10/2011 |

* cited by examiner

- - - - 0.9
— - — 0.8
— - - — 0.7

EVAPORATION APPARATUS AND EVAPORATION METHOD

TECHNICAL FIELD

The present invention relates to an evaporation apparatus and an evaporation method.

Priority is claimed on Japanese Patent Application No. 2014-115103, filed Jun. 3, 2014, the content of which is incorporated herein by reference.

BACKGROUND ART

In performing patterning on a substrate using a vacuum evaporation method, a method in which evaporation is performed while an evaporation source is moved relative to a substrate such that a film thickness is uniformized has been proposed.

An angle of incidence of evaporated particles increases from 0° (normal incidence) as a place at which the evaporated particles are deposited recedes from an evaporation source in a surface of a substrate on which the evaporated particles are deposited. For this reason, a speed at which a deposition film is deposited in a direction which is perpendicular to the substrate becomes slower as a place at which the evaporated particles are deposited recedes from the evaporation source. When a speed at which the deposition film is deposited differs at each point in the surface, non-uniformity occurs with regard to a film thickness. The evaporation source is moved relative to the substrate in one direction which is perpendicular to the substrate to prevent this phenomenon. Angles of incidence of evaporated particles at the same point in the surface of the substrate are continuously changed in consideration of a direction in which the evaporation source is moved relative to the substrate while the evaporation is performed. The evaporation source is moved relative to the substrate so that an average of the angles of incidence of the evaporated particles over time while the evaporation is performed can be uniformized in the surface. Thus, the film thickness can be uniformized.

In the above-described method, with regard to a direction which is parallel to the substrate and is perpendicular to a direction in which the evaporation source is moved relative to the substrate, the film thickness needs to be separately corrected. For example, a method of moving a film thickness correction plate provided between the evaporation source and the substrate together with the evaporation source has been proposed (for example, Patent Document 1).

PRIOR ART DOCUMENTS

Patent Document

[Patent Document 1]
Japanese Unexamined Patent Application, First Publication No. 2007-227359

SUMMARY OF THE INVENTION

Problem to Be Solved by the Invention

However, since a weight of the evaporation source is heavy, a size of a driving mechanism configured to move the evaporation source is large. When the evaporated particles are deposited on an especially large substrate, there is a problem in which the driving mechanism of the evaporation source is also enlarged and apparatus costs are thus increased in accordance with a size of the substrate.

Some aspects of the present invention were made in view of the above-described circumstances, and an object of the present invention is to provide an evaporation apparatus and an evaporation method which are capable of uniformizing a film thickness of a deposition film using a simple driving mechanism.

Means for Solving the Problems

An evaporation apparatus according to a first aspect of the present invention includes: a substrate holding section configured to hold a substrate; an evaporation mask having an opening part at a position which is opposite to one surface of the substrate; an evaporation source configured to supply the one surface with evaporated particles via the opening part and to form a film of the evaporated particles on the one surface exposed from the opening part; and a film thickness correction means configured to block a portion of an ejection path of the evaporated particles from the evaporation source toward the opening part and configured to correct a thickness of the film by changing a position at which the ejection path is blocked over time.

In the evaporation apparatus according to the first aspect of the present invention, the film thickness correction means may include a shielding member configured to be moved across the ejection path.

In the evaporation apparatus according to the first aspect of the present invention, a moving speed of the shielding member when the shielding member crosses a central portion of the ejection path may be different from a moving speed of the shielding member when the shielding member crosses an outer circumferential portion of the ejection path.

In the evaporation apparatus according to the first aspect of the present invention, the shielding member may have an opening part corresponding to the opening part of the evaporation mask, and the one surface may be supplied with evaporated particles via the opening part of the evaporation mask and the opening part of the shielding member.

In the evaporation apparatus according to the first aspect of the present invention, the film thickness correction means may include a shielding member configured to be rotated about a rotating shaft which is parallel to the one surface to block a portion of the ejection path.

In the evaporation apparatus according to the first aspect of the present invention, a rotational speed of the shielding member when the shielding member blocks a central portion of the ejection path may be different from a rotational speed of the shielding member when the shielding member blocks an outer circumferential portion of the ejection path.

In the evaporation apparatus according to the first aspect of the present invention, the shielding member may be rotated about a rotating shaft which is parallel to the one surface while moving across the ejection path.

In the evaporation apparatus according to the first aspect of the present invention, a moving speed of the shielding member when the shielding member crosses a central portion of the ejection path may be different from a moving speed of the shielding member when the shielding member crosses an outer circumferential portion of the ejection path.

An evaporation method according to a first aspect of the present invention in which one surface of a substrate is supplied with evaporated particles via an opening part of an evaporation mask from an evaporation source and the one surface which is exposed through the opening part is formed with a film made of the evaporated particles, includes:

blocking, while evaporation is performed, by a film thickness correction means, a portion of an ejection path of the evaporated particles from the evaporation source toward the opening part, and correcting a thickness of the film by changing a position, at which the ejection path is blocked, by the film thickness correction means over time.

In the evaporation method according to the first aspect of the present invention, the film thickness correction means may include a shielding member configured to be moved across the ejection path.

In the evaporation method according to the first aspect of the present invention, a moving speed of the shielding member when the shielding member crosses a central portion of the ejection path may be different from a moving speed of the shielding member when the shielding member crosses an outer circumferential portion of the ejection path.

In the evaporation method according to the first aspect of the present invention, the shielding member may include an opening part corresponding to the opening part of the evaporation mask, and the one surface is supplied with evaporated particles via the opening part of the evaporation mask and the opening part of the shielding member.

In the evaporation method according to the first aspect of the present invention, the film thickness correction means may include a shielding member configured to be rotated about a rotating shaft which is parallel to the one surface to block a portion of the ejection path.

In the evaporation method according to the first aspect of the present invention, a rotational speed of the shielding member when the shielding member blocks a central portion of the ejection path may be different from a rotational speed of the shielding member when the shielding member blocks an outer circumferential portion of the ejection path.

In the evaporation method according to the first aspect of the present invention, the shielding member may be rotated about a rotating shaft which is parallel to the one surface while moving across the ejection path.

In the evaporation method according to the first aspect of the present invention, a moving speed of the shielding member when the shielding member crosses a central portion of the ejection path may be different from a moving speed of the shielding member when the shielding member crosses an outer circumferential portion of the ejection path.

Effect of the Invention

According to some aspects of the present invention, it is possible to provide an evaporation apparatus and an evaporation method which are capable of uniformizing a film thickness of a deposition film using a simple driving mechanism regardless of a size of a substrate.

BRIEF DESCRIPTIONS OF THE DRAWINGS

EMBODIMENTS FOR CARRYING OUT THE INVENTION

First Embodiment

Hereinafter, a first embodiment of the present invention will be described with reference to FIGS. 1 to 7C.

(Evaporation Apparatus)

Figure 1:
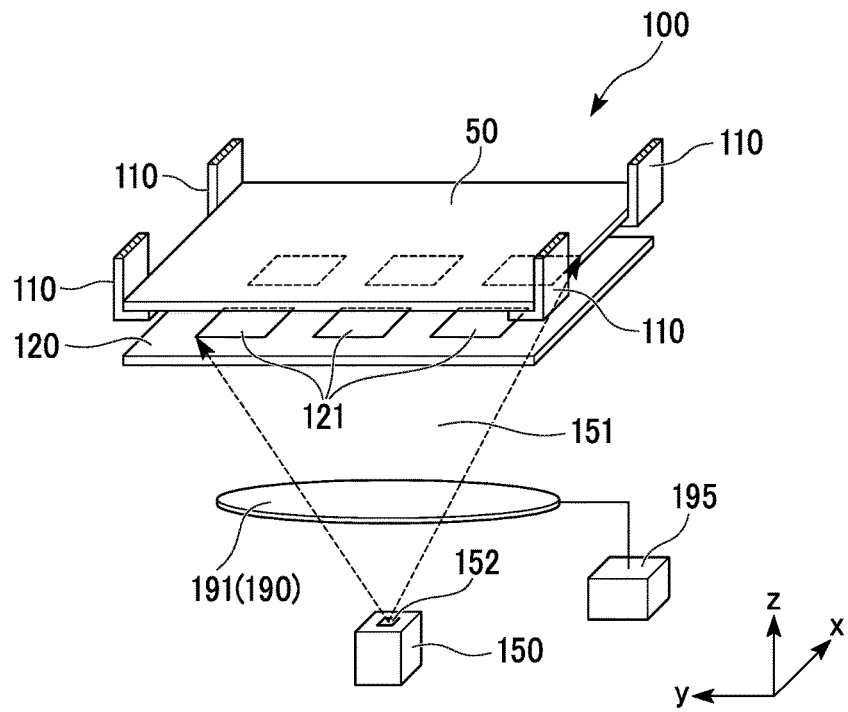
FIG. 1 is a perspective view showing a schematic structure of an evaporation apparatus related to a first embodiment.

Hereinafter, an evaporation apparatus 100 related to this embodiment will be described with reference to FIGS. 1 to 3B. As shown in FIG. 1, the evaporation apparatus 100 includes a substrate holding section 110, an evaporation mask 120, an evaporation source 150, and a film thickness correction means 190.

The substrate holding section 110 holds a substrate 50 such that one surface 51 (refer to FIG. 2) of the substrate 50 faces the evaporation source 150. A member with a known constitution such as, for example, an arm-like member can be used as the substrate holding section 110.

Figure 2:
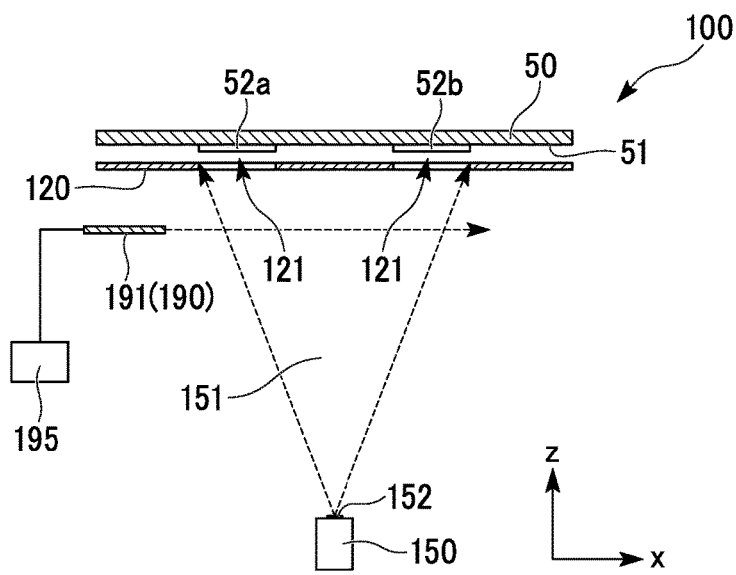
FIG. 2 is a side view showing the schematic structure of the evaporation apparatus related to the first embodiment.

The evaporation mask 120 is disposed at the one surface 51 side of the substrate 50. An opening part 121 is provided in the evaporation mask 120. The opening part 121 includes a plurality of pattern openings. A shape of the pattern openings corresponds to a shape of patterns of deposition films which are formed on the one surface 51. The evaporation mask 120 is held by a mask holding section (not shown). The evaporation mask 120 is in contact with the substrate 50 or is held in a state in which a very narrow gap is maintained between the evaporation mask 120 and the substrate 50. Evaporating is performed in this state so that, for example, as shown in FIG. 2, a plurality of deposition films are each formed at places 52a and 52b in the one surface 51 which is opposite to the opening part 121.

Referring again to FIG. 1, the evaporation source 150 supplies the one surface 51 with evaporated particles via the opening part 121. Thus, a film made of the evaporated particles is formed on the one surface 51 which is exposed through the opening part 121.

In this embodiment, since the evaporation source 150 is not moved relative to the fixed substrate 50, the evaporation apparatus 100 does not include a driving mechanism configured to move the evaporation source 150. Thus, driving costs of the evaporation source 150 can be reduced.

The evaporation source 150 has, for example, a single nozzle 152. A size of an opening part of the nozzle 152 is sufficiently smaller than a size of the substrate 50. For this reason, there is a substantially one opening part in the nozzle 152, and evaporated particles are regarded as flying to the substrate 50 from the opening part. Also, the evaporated particles isotropically fly from the opening part of the nozzle 152.

Here, a space including a plurality of conical regions in which the pattern openings included in the opening part 121 of the evaporation mask 120 are configured to be included in a bottom surface, and the opening part of the nozzle 152 of the evaporation source 150 is configured to be located at a top is defined as an ejection path 151 of the evaporated particles. The ejection path 151 is a set of paths through which the evaporated particles fly toward the opening part 121. Note that, when the ejection path 151 is illustrated, for the sake of convenience, only an outermost surface of the ejection path 151 is represented by a dotted line.

The evaporation source 150 includes, for example, a shutter (not shown). The shutter is provided to be freely inserted between the evaporation source 150 and the substrate 50. The shutter is inserted between the evaporation source 150 and the substrate 50 before evaporating starts and after the evaporating has ended, and the ejection path 151 of the evaporated particles is fully closed. The shutter is removed from a portion between the evaporation source 150 and the substrate 50 while the evaporation is performed, and the ejection path 151 of the evaporated particles is fully open.

Figure 3A:
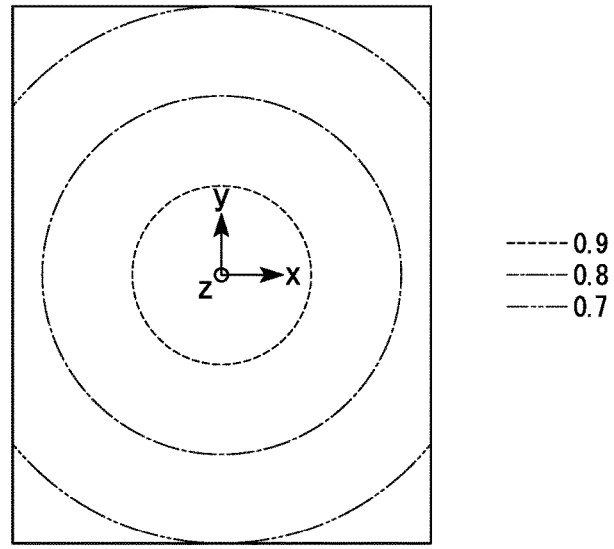
FIG. 3A is a first view for describing a rate distribution in the first embodiment.
Figure 3B:
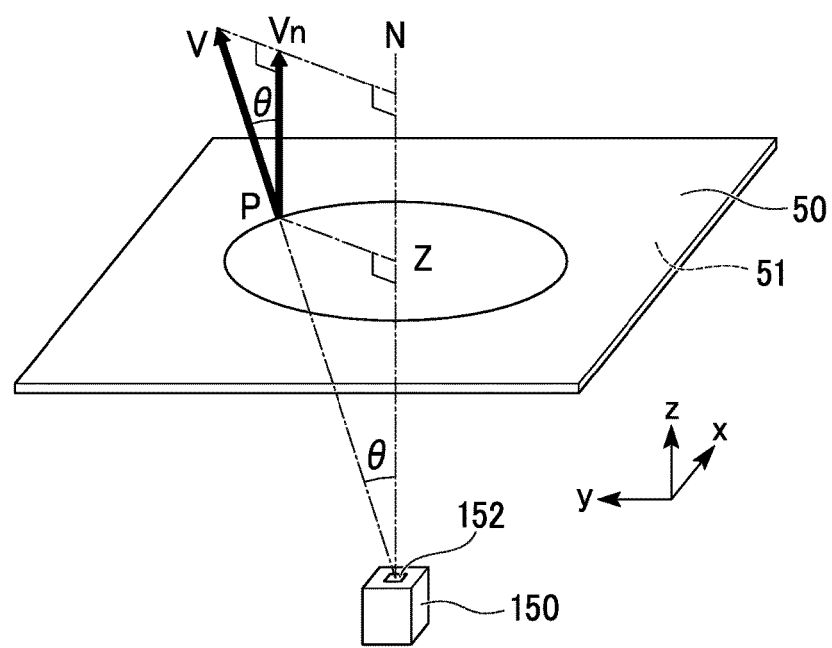
FIG. 3B is a second view for describing the rate distribution in the first embodiment.

Hereinafter, a distribution (hereinafter referred to as a "rate distribution") of speeds at which films of the evaporated particles are deposited on the one surface 51 of the substrate 50 will be described with reference to FIGS. 3A and 3B. FIG. 3A is a plan view illustrating an example of the rate distribution of this embodiment in the one surface 51 when viewed from an upper surface (which is on the side opposite to the evaporation source 150) of the substrate 50. Here, a value of the rate distribution is normalized using a value of a rate distribution at a point Z in the one surface 51 which is just above the opening part of the nozzle 152. FIG. 3B is a schematic diagram for describing the rate distribution at a point P on the one surface 51.

The speeds at which the films of the evaporated particles are deposited differ at the points on the one surface 51. As shown in FIG. 3B, a magnitude of a component $v_n$ at the one surface 51 in a normal line N direction among incident velocity vectors v of the evaporated particles is proportional to $\cos \theta$ at the point P which is on the one surface 51. Here, $\theta$ is an angle which is formed by a straight line connecting the nozzle 152 of the evaporation source 150 and the point P and a normal line N. The speeds at which the films of the evaporated particles are deposited are given as magnitudes of $v_n$. Therefore, as shown in FIG. 3A, a shape of the rate distribution has a concentric distribution having the point Z which is just above the nozzle 152 of the evaporation source 150 as a center. Also, an amount of the rate distribution increases closer to the point Z.

Referring again to FIGS. 1 and 2, the film thickness correction means 190 blocks a portion of the ejection path 151 of the evaporated particles from the evaporation source 150 toward the opening part 121. The film thickness correction means 190 is driven by a driving mechanism 195. The film thickness correction means 190 is moved relative to the substrate 50 in one direction which is parallel to the one surface 51 so that a position at which the film thickness correction means 190 blocks the ejection path 151 is changed over time. The film thickness correction means 190 is moved relative to the substrate 50 so that an evaporating time at a point having a relatively higher distribution rate in the one surface 51 can be relatively reduced. As a result, a thickness of the film made of the evaporated particles is corrected.

Hereinafter, as coordinate axes, an axis which is parallel to a direction in which the film thickness correction means 190 is moved relative to the substrate 50 is set as an x axis, an axis in a direction which is parallel to the one surface 51 and is perpendicular to the x axis is set as a y axis, and an axis in a direction which is perpendicular to the x axis and the y axis is set as a z axis. The origin of the coordinate axes is set at a position of the opening part of the nozzle 152.

In this embodiment, as shown in FIG. 2, the film thickness correction means 190 includes a shielding member 191 configured to move to cross the ejection path 151. The shielding member 191 is a plate-like member and is moved in the x direction parallel to the substrate 50 while the evaporation is performed. A length L of the shielding member 191 in the y direction is set to be the same as or to be longer than a length of the substrate in the y direction. The shielding member 191 can be constituted of a member which is smaller and lighter than the evaporation source 150. Since only the shielding member 191 is driven in this embodiment, apparatus costs can be reduced.

(Uniformity of Film Thickness)

Hereinafter, uniformity of a film thickness in the evaporation apparatus 100 will be described with reference to FIGS. 4A to 6B. The film thickness can be uniformized in the y direction and the x direction. As will be described below, a shape of the shielding member 191 is designed so that a film thickness in the y direction can be uniformized. A film thickness in the x direction can be uniformized by changing a moving speed of the shielding member 191 according to a place.

The film thickness is qualitatively uniformized according to the following guidelines. The film thickness is given as a product of each of speeds at which evaporated particles are deposited and an evaporating time. Amounts of rate distributions serving as the speeds at which the evaporated particles are deposited decrease as the place at which the evaporated particles are deposited recedes from a center point of the one surface 51. Therefore, while the evaporation is performed, a time during which shielding is performed by the shielding member 191 becomes longer and an evaporating time becomes shorter as the place at which the evaporated particles are deposited nears the center point of the one surface 51. On the other hand, a time at which shielding is performed by the shielding member 191 becomes shorter and an evaporating time becomes longer as the place at which the evaporated particles are deposited recedes from the center point of the one surface 51. Thus, as described above, the film thickness in the one surface 51 is uniformized.

(Film Thickness Uniformity in the Y Direction)

Figure 4A:
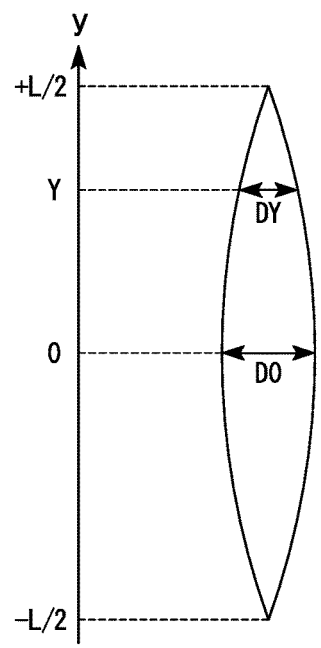
FIG. 4A is a first view for describing uniformity of a film thickness in a y direction in the first embodiment.
Figure 4B:
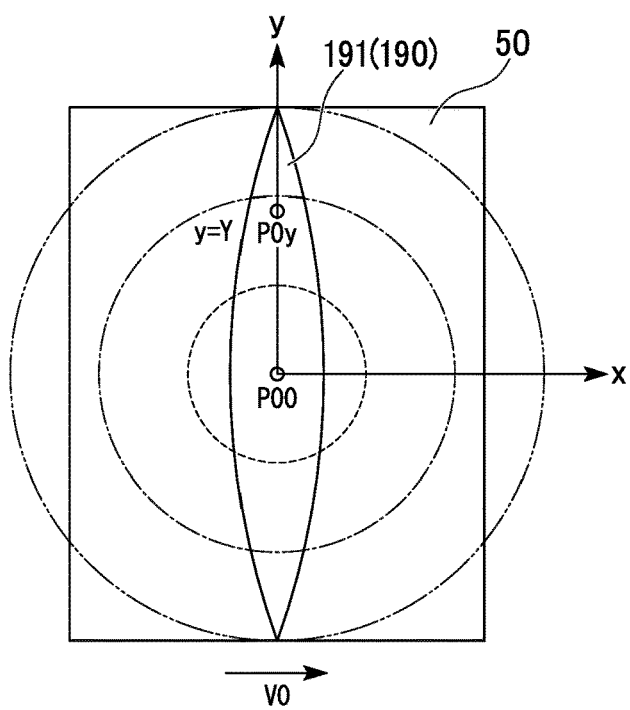
FIG. 4B is a second view for describing the uniformity of the film thickness in the y direction in the first embodiment.
Figure 4C:
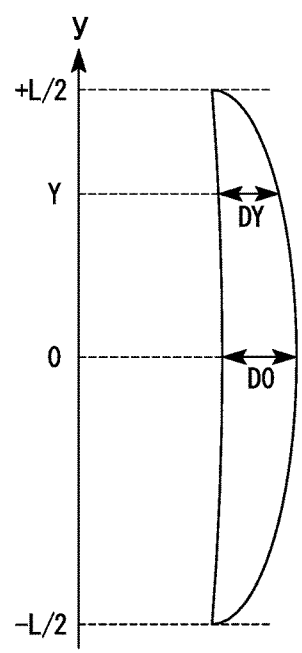
FIG. 4C is a third view for describing the uniformity of the film thickness in the y direction in the first embodiment.

Hereinafter, film thickness uniformity in the y direction will be described with reference to FIGS. 4A to 4C. As shown in FIG. 4A, here, a width of the shielding member 191 in the case of y=Y is represented as $D_Y$. In design guidelines of the shape of the shielding member 191, $D_Y$ is qualitatively reduced as an absolute value of Y is increased (the width of the shielding member 191 has a maximum value $D_0$ in the case of y=0). Thus, a time during which places with the same x coordinate are shielded by the shielding member 191 against the evaporation source 150 becomes shorter as the place at which the evaporated particles are deposited recedes from the center point of the one surface 51. As described above, the film thickness in the one surface 51 in the y direction is uniformized.

Hereinafter, a specific design example of the shape of the shielding member 191 will be described. The following determination method is merely an example, and this embodiment is not limited to the determination method.

Hereinafter, a time at which the evaporated particles start to be evaporated is set as t=0 s, and a time at which the evaporating of the evaporated particles ends is set as t=T [s]. Also, a point which is at a position of x=X [mm] and y=Y [mm] in the one surface 51 is generally represented as $P_{XY}$.

An amount of a rate distribution at the point $P_{XY}$ is represented as $R_{XY}$ [μm/s]. Generally, a film thickness at the point $P_{XY}$ is given as:

$$R_{XY} \times (T - \Delta T_{XY}) \text{ [μm]}.$$

Here, $\Delta T_{XY}$ [s] is a time for which the point $P_{XY}$ is shielded by the shielding member 191 against the evaporation source 150 ($T > \Delta T_{XY}$).

Hereinafter, a width $D_Y$ [mm] of the shielding member 191 is determined such that a film thickness at a point $P_{0Y}$ is uniform with a film thickness at a point $P_{00}$. As shown in FIG. 4B, a speed when the shielding member 191 passes through x=0 mm is set as $V_0$ [mm/s].

While the point $P_{0Y}$ and the point $P_{00}$ are shielded by the shielding member 191 against the evaporation source 150, the speed of the shielding member 191 always approximates to being equal to $V_0$ [mm/s]. At this time, $\Delta T_{0Y}$ [s] and $\Delta T_{00}$ [s] are represented by the following expression using $V_0$ [mm/s].

$$\Delta T_{0Y} = D_Y/V_0 \text{ and } \Delta T_{00} = D_0/V_0$$

Since the film thickness at the point $P_{0Y}$ is equal to the film thickness at the point $P_{00}$, $$R_{0Y} \times (T - \Delta T_{0Y}) = R_{00} \times (T - \Delta T_{00}) \text{ is satisfied.}$$

Approximation formulas of $\Delta T_{0Y}$ [s] and $\Delta T_{00}$ [s] are substituted into this expression so that the following equation is acquired:

$$R_{0Y} \times (T - D_Y/V_0) = R_{00} \times (T - D_0/V_0).$$

Since $R_{0Y}$ [μm/s] and $R_{00}$ [μm/s] are parameters which are determined by relative positions between the points $P_{0Y}$ and $P_{00}$ and the evaporation source 150, $D_Y$ [mm] can be determined with respect to T [s], $V_0$ [mm/s], and $D_0$ [mm] which are given. Considering that $0 < R_{0Y} < R_{00}$ (refer to FIG. 3A), $T - D_Y/V_0 > T - D_0/V_0 > 0$ is satisfied. As qualitatively described above based on the foregoing description, $D_Y < D_0$ is satisfied. To be more specific, $D_Y$ [mm] is given as:

$$D_Y = D_0 - (R_{00}/R_{0Y} - 1) \times (V_0 T - D_0).$$

The shielding member 191 in FIG. 4A has a shape in which both surfaces are symmetrically convex, but the shape of the shielding member 191 is not limited to such a shape. For example, the shape thereof may be an asymmetrical shape as shown in FIG. 4C.

Also, the number of shielding members 191 is not limited to one, and a plurality of shielding members 191 may be used.

$D_Y$ [mm] is determined as described above so that the film thickness in the y direction can be uniformized in the case of x=0 mm.

(Film Thickness Uniformity in the X Direction)

In this embodiment, a moving speed of the shielding member 191 when the shielding member 191 crosses a central portion of the ejection path 151 is different from a moving speed of the shielding member 191 when the shielding member 191 crosses an outer circumferential portion of the ejection path 151. Thus, a film thickness in the x direction can be uniformized.

Figure 5A:
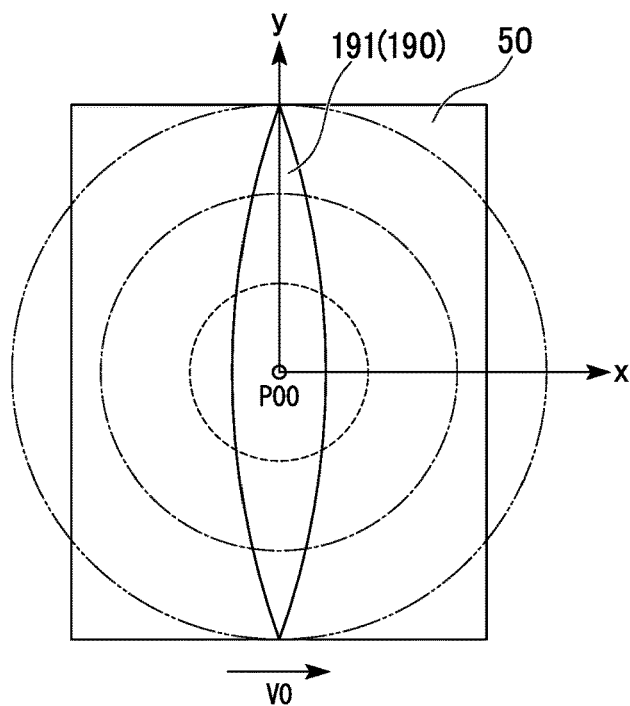
FIG. 5A is a first view for describing uniformity of a film thickness in an x direction in the first embodiment.
Figure 5B:
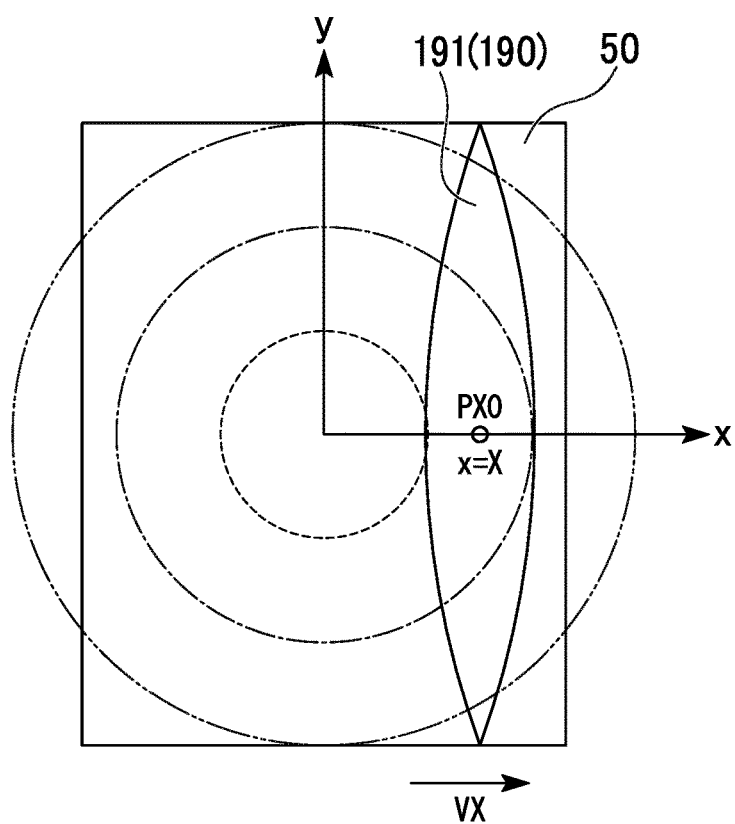
FIG. 5B is a second view for describing the uniformity of the film thickness in the x direction in the first embodiment.

Hereinafter, film thickness uniformity in the x direction will be described with reference to FIGS. 5A and 5B. As shown in FIG. 5B, here, a moving speed of the shielding member 191 in the case of x=X [mm] is represented as $V_X$. In guidelines in which the speed is determined, $V_X$ [mm/s] is qualitatively increased as an absolute value of X is increased (the moving speed of the shielding member 191 has a value $V_0$ in the case of y=0 mm). Thus, a time during which places with the same y coordinate are shielded by the shielding member 191 against the evaporation source 150 becomes shorter as the place at which the evaporated particles are deposited recedes from the center point of the one surface 51. As described above, the film thickness in the one surface 51 in the x direction is uniformized.

Hereinafter, a specific example of a method of determining the moving speed of the shielding member 191 will be described. The following determination method is merely an example, and this embodiment is not limited to the determination method.

Hereinafter, a speed $V_X$ [mm/s] of the shielding member 191 in the case of x=X [mm] is determined such that a film thickness at a point $P_{X0}$ is uniform with a film thickness at a point $P_{00}$. By using $V_X$ [mm/s], $\Delta T_{X0}$ [s] can be approximated as:

$$\Delta T_{X0} = D_0/V_X [s].$$

Since the film thickness at the point $P_{X0}$ is equal to the film thickness at the point $P_{00}$, the following is satisfied:

$$R_{X0} \times (T - \Delta T_{X0}) = R_{00} \times (T - \Delta T_{00}).$$

Approximation formulas of $\Delta T_{X0}$ [s] and $\Delta T_{00}$ [s] are substituted into this expression so that the following equation is acquired:

$$R_{X0} \times (T - D_0/V_X) = R_{00} \times (T - D_0/V_0).$$

Since $R_{X0}$ [μm/s] and $R_{00}$ [μm/s] are parameters which are each determined by relative positions between the points $P_{X0}$ and $P_{00}$ and the evaporation source 150, $V_X$ can be determined with respect to T [s], $V_0$ [mm/s], and $D_0$ [mm] which are given. Considering that $0 < R_{X0} < R_{00}$ (refer to FIG. 3A), it is satisfied that $T - D_0/V_X > T - D_0/V_0 > 0$. As qualitatively described above based on the foregoing description, it is satisfied that $V_X > V_0$. To be more specific, $V_X$ [mm/s] is given as:

$$V_X = 1/[1/V_0 - (R_{00}/R_{X0} - 1) \times (T/D_0 - 1/V_0)].$$

Figure 6A:
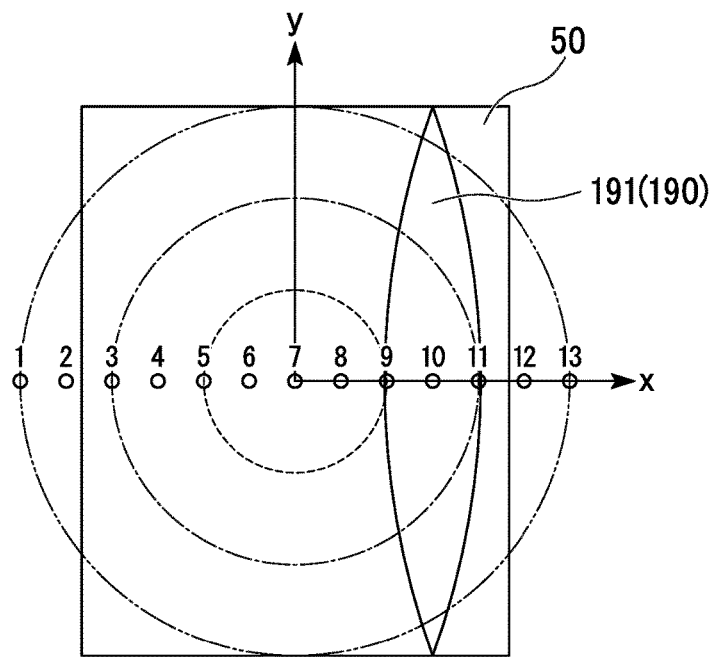
FIG. 6A is a first schematic diagram indicating a moving speed of a shielding member in the first embodiment.
Figure 6B:
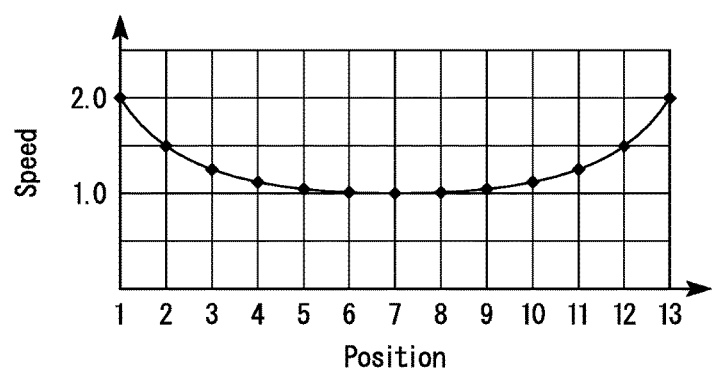
FIG. 6B is a second schematic diagram indicating the moving speed of the shielding member in the first embodiment.

As a result, as shown in FIGS. 6A and 6B, the moving speed of the shielding member 191 is increased as the place at which the evaporated particles are deposited recedes from the center point (corresponding to a position 7 in FIGS. 6A and 6B) of the one surface 51. Here, in FIG. 6A, positions through which a center of the shielding member 191 passes while the evaporation is performed are represented as positions 1 to 13 (in the case of the shielding member 191, only a case in which the center thereof is at the position 10 is illustrated). FIG. 6B is a graph schematically indicating the moving speed of the shielding member 191 at the points shown in FIG. 6A (a horizontal axis: positions and a vertical axis: speeds [values normalized using a speed at the position 7]).

$V_X$ [mm/s] is determined as described above so that the film thickness in the x direction in the case of y=0 mm can be uniformized.

As described above, the shape of the shielding member 191 is designed so that the film thickness in the y direction in the case of x=0 mm can be uniformized. Also, the film thickness in the x direction in the case of y=0 mm can be uniformized by changing the moving speed of the shielding member 191 according to a place. The film thickness is uniformized based on these two directions so that the film thickness is uniformized also at points in general in the one surface 51.

Note that the above-described method of determining the parameters is merely a simple example using approximation. For example, numerical calculation or a simulation may be used so that the parameters can be more precisely determined and the film thickness can also be uniformized.

The first embodiment of the present invention has been described above. According to this embodiment, the evaporation apparatus 100 does not include a driving mechanism configured to move the substrate 50 or the evaporation source 150. The evaporation apparatus 100 can be used as long as the evaporation apparatus 100 includes only the driving mechanism 195 configured to move the shielding member 191. Therefore, the film thickness in the y direction can be uniformized while apparatus costs incurred to provide the driving mechanism are minimized in accordance with this embodiment.

According to this embodiment, the film thickness in the x direction can also be uniformized by changing the moving speed of the shielding member 191 according to a place.

Note that, in this embodiment, the evaporation source 150 does not necessarily need to completely stop. If the evaporation source 150 is fixed during a period of time in which the film is formed on the substrate, the evaporation source 150 may be moved in other periods. For example, evaporated particles may be evaporated in a form in which the evaporating of the evaporated particles accompanied by transportation of a film thickness correction plate is initially performed on a certain row of the substrate 50, the evaporation source 150 or the substrate 50 is moved after the evaporating for the row has been completed, and the next row of the substrate 50 is evaporated. Thus, with regard to a particularly ultra-large substrate 50, a whole surface of the substrate 50 can be efficiently evaporated by a single evaporation source 150.

In this embodiment, a single evaporation source and a single correction plate are used, but a plurality of evaporation sources or a plurality of correction plates may be used.

In this embodiment, a shape of the evaporation source 150 may differ. Hereinafter, an example of a case in which the shape of the evaporation source 150 differs will be described with reference to FIGS. 7A to 7C.

Figure 7A:
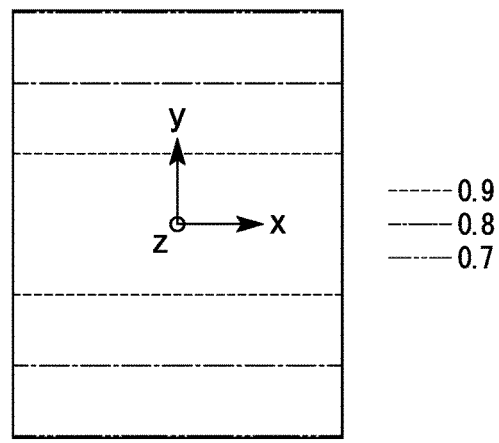
FIG. 7A is a first view for describing a case in which shapes of evaporation sources differ in the first embodiment.
Figure 7B:
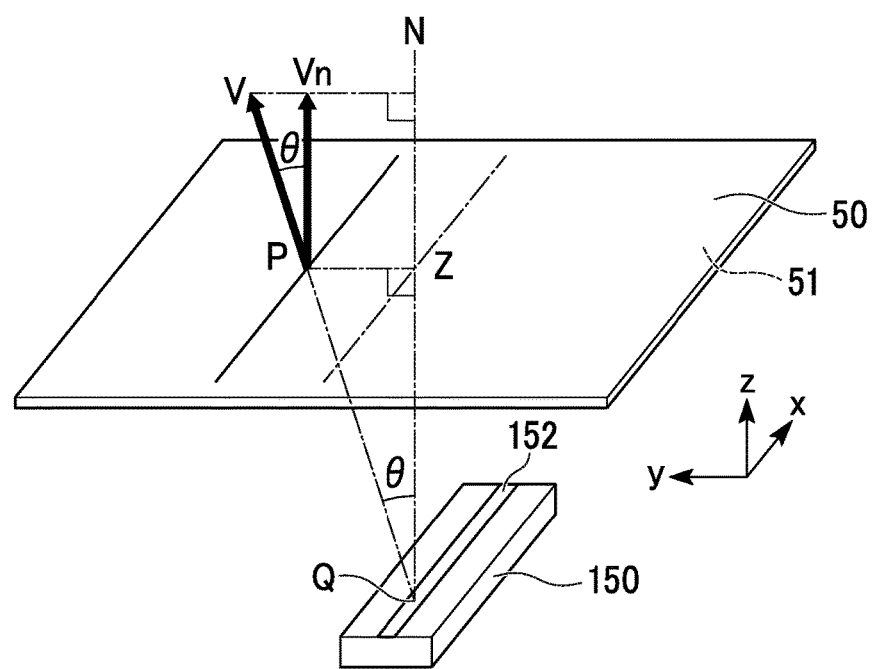
FIG. 7B is a second view for describing when the shapes of the evaporation sources differ in the first embodiment.

As shown in FIG. 7B, the evaporation source 150 may have the single nozzle 152 of which an opening part extends in the x direction. In this case, the rate distribution in the x direction is uniform. In other words, as shown in FIG. 7B, a point of intersection of a surface which includes P and is perpendicular to the x axis and the opening part of the nozzle 152 is set as Q, a foot of a perpendicular line from Q to the one surface 51 is set as Z, and an angle ZQP is θ. The rate distribution at the point P is proportional to cos θ. Values of θ of points in the one surface 51, in which y coordinates are the same, are equal to each other. For this reason, as shown in FIG. 7A, the rate distribution thereof is a distribution which is uniform in the x direction.

Figure 7C:
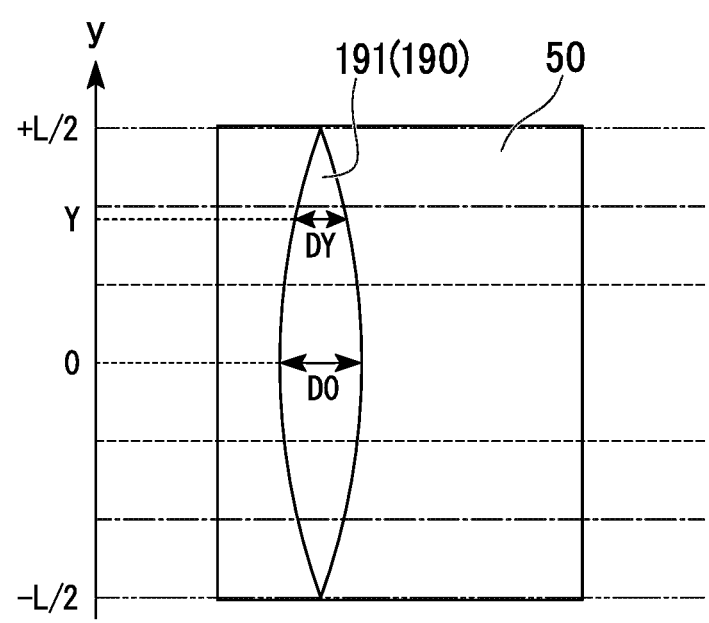
FIG. 7C is a third view for describing when the shapes of the evaporation sources differ in the first embodiment.

In this case, since the rate distribution is uniform in the x direction, the film thickness does not need to be uniformized in the x direction. Therefore, the shielding member 191 may be designed so that the film thickness is uniformized in the y direction as carried out in the first embodiment. As shown in FIG. 7C, the shielding member 191 having the width $D_Y$ in the case of y=Y may be moved at a constant speed $V_0$ in the x direction while the evaporated particles are evaporated.

As described above, in this embodiment, the film thickness correction means 190 includes the shielding member 191 configured to be moved across the ejection path 151. Thus, the film thickness can be corrected even without moving the evaporation source 150.

Also, in this embodiment, a width of the shielding member 191 in a portion of the shielding member 191, which crosses the central portion of the ejection path 151, is different from a width of the shielding member 191 in a portion of the shielding member 191, which crosses the outer circumferential portion of the ejection path 151. Thus, the film thickness can be corrected by changing a time during which each place in the one surface 51 is shielded by the shielding member 191.

Second Embodiment

Hereinafter, a second embodiment of the present invention will be described with reference to FIGS. 8A to 10D. The same constitution elements as those of FIGS. 1 to 7C are denoted with the same reference numerals, and the descriptions thereof will be omitted.

Figure 8A:
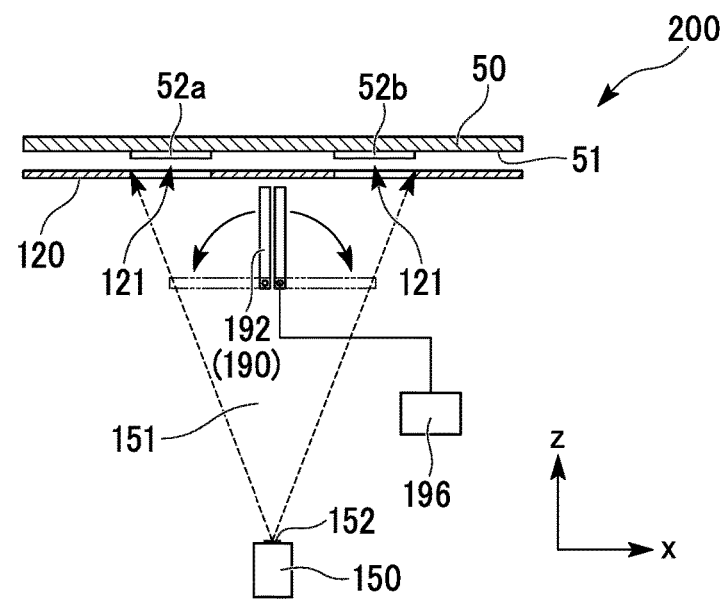
FIG. 8A is a first view showing a schematic structure of an evaporation apparatus and a shielding member in a second embodiment.

As shown in FIG. 8A, in this embodiment, a film thickness correction means 190 includes a shielding member 192.

The shielding member 192 is rotated about a rotating shaft which is parallel to one surface 51 to block a portion of an ejection path 151. Also, a rotational speed of the shielding member 192 when the shielding member 192 blocks a central portion of the ejection path 151 is different from a rotational speed of the shielding member 192 when the shielding member 192 blocks an outer circumferential portion of the ejection path 151. In these respects, the second embodiment is significantly different from the first embodiment.

Figure 8B:
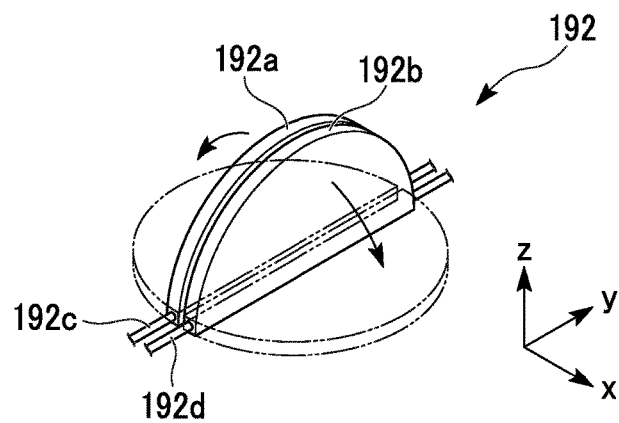
FIG. 8B is a second view showing the schematic structure of the evaporation apparatus and the shielding member in the second embodiment.
Figure 9A:
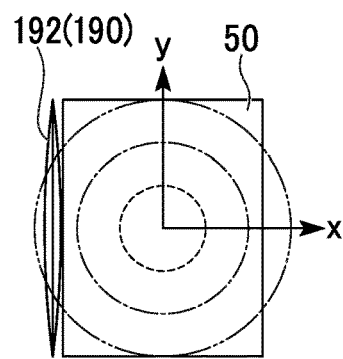
FIG. 9A is a first schematic diagram for describing an operation of the shielding member in the second embodiment.
Figure 9B:
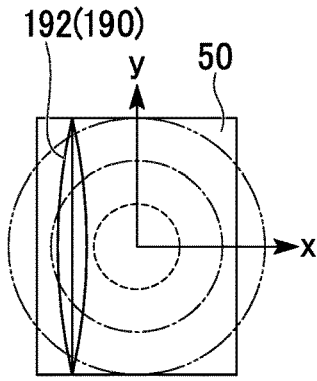
FIG. 9B is a second schematic diagram for describing the operation of the shielding member in the second embodiment.
Figure 9C:
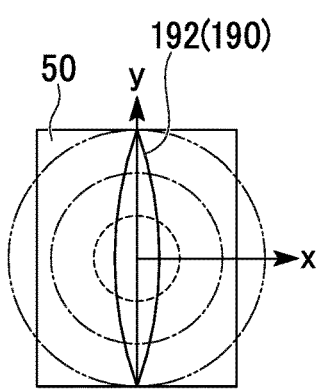
FIG. 9C is a third schematic diagram for describing the operation of the shielding member in the second embodiment.
Figure 9D:
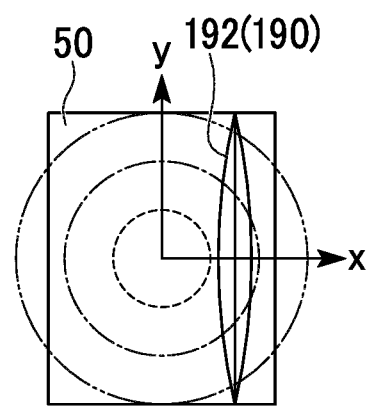
FIG. 9D is a fourth schematic diagram for describing the operation of the shielding member in the second embodiment.
Figure 9E:
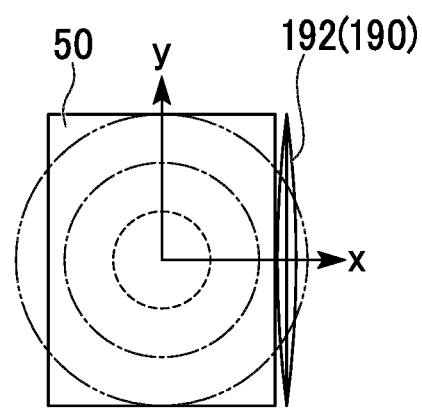
FIG. 9E is a fifth schematic diagram for describing the operation of the shielding member in the second embodiment.

As shown in FIG. 8B, the shielding member 192 includes two plate-like members 192a and 192b. The plate-like members 192a and 192b have, for example, semi-circular surfaces. The plate-like members 192a and 192b have, for example, rotating shafts 192c and 192d which are parallel to the y axis at positions corresponding to semi-circular diameters. The rotating shafts 192c and 192d are disposed so as to be parallel with each other and to have roughly the same interval therebetween as plate thicknesses of the plate-like members 192a and 192b.

Hereinafter, as shown by a solid line in FIG. 8B, a disposition in which surfaces of the plate-like members 192a and 192b have angles of intersection of 90° with respect to an xy plane is referred to as a "closed state." Also, as shown by a broken line in FIG. 8B, a disposition (a disposition in which the surfaces are parallel to the xy plane) in which the surfaces of the plate-like members 192a and 192b have angles of intersection of 0° with respect to the xy plane is referred to as an "open state."

Note that, in FIGS. 8A and 8B, the plate-like member 192a or 192b in the closed state is located vertically above (in a direction of increase in a z coordinate) the plate-like member 192a or 192b in the open state, but the present invention is not limited to this aspect. For example, in the closed state, the plate-like member 192a or 192b may be located vertically lower (in a direction of decrease in the z coordinate) than in the open state. Also, the rotating shaft 192c or 192d may not be parallel to the y axis, and for example, may be parallel to the x axis.

The plate-like members 192a and 192b are driven by a driving mechanism 196 so that the plate-like members 192a and 192b are rotated about the rotating shafts 192c and 192d. Thus, the angles of intersection formed by the plate-like members 192a and 192b and the xy plane can have any values between 0° (the open state) and 90° (the closed state). The plate-like members 192a and 192b may be rotated in synchronization with each other such that the angles of intersection formed by the plate-like members 192a and 192b and the xy plane are always equal to each other, and may be independently rotated.

The shielding member 192 is driven by a driving mechanism 195 as in the first embodiment so that the shielding member 192 may be moved relative to a substrate 50 as a whole in one direction. Thus, the shielding member 192 blocks a portion of the ejection path 151 of evaporated particles from the evaporation source 150 toward an opening part 121. The shielding member 192 is moved relative to the substrate 50 in one direction which is parallel to the one surface 51 so that a position thereof at which the ejection path 151 is blocked is changed over time.

In this embodiment, the plate-like members 192a and 192b can be rotated between the open state and the closed state. Thus, an effective area in which the ejection path 151 is blocked by the shielding member 192 can be changed together with the position of the shielding member 192 while the shielding member 192 is moving relative to the substrate 50. Thus, since the number of control means is increased compared to when a film thickness is uniformized by only a design of a shape of a shielding member 191 and a change in moving speed as in the first embodiment, more fine deposition of evaporated particles on the one surface 51 can be controlled. Also, the film thickness can also be uniformized by changing the effective area in which the ejection path 151 is blocked by the shielding member 192 instead of changing a moving speed of the shielding member 191 as in the first embodiment. Thus, there is no need to change a speed at which the shielding member 191 is moved relative to the substrate 50. As a result, since a mechanism of an evaporation apparatus 200 becomes simpler, apparatus costs can be reduced.

(Uniformity in the Film Thickness)

Hereinafter, an example of uniformity of a film thickness in this embodiment will be described with reference to FIGS. 9A to 9E. The film thickness is uniformized in the y direction and the x direction. As will be described below, a film thickness in the y direction can be uniformized by designing a shape of the shielding member 192 in the open state. A film thickness in the x direction can be uniformized by changing the moving speed of the shielding member 192 and the effective area according to a place.

The shielding member 192 is disposed such that the rotating shafts 192c and 192d of the plate-like members 192a and 192b are parallel to the y axis as in FIGS. 8A and 8B. The plate-like members 192a and 192b are rotated about the rotating shafts 192c and 192d while the shielding member 192 is moved relative to the substrate 50. Thus, the effective area in which the ejection path 151 is blocked by the shielding member 192 is changed while the shielding member 192 is moved. FIGS. 9A to 9E show the effective areas of the shielding member 192 at positions while the shielding member 192 is moved.

The film thickness is qualitatively uniformized according to the following guidelines. The film thickness is given as a product of each of speeds at which evaporated particles are deposited and an evaporating time. Amounts of rate distributions serving as the speeds at which the evaporated particles are deposited are reduced as the place at which the evaporated particles are deposited recedes from a center point of the one surface 51. Therefore, while the evaporation is performed, a time at which shielding is performed by the shielding member 192 becomes longer and an evaporating time becomes shorter as the place at which the evaporated particles are deposited nears the center point of the one surface 51. On the other hand, a time at which shielding is performed by the shielding member 192 becomes shorter and an evaporating time becomes longer as the place at which the evaporated particles are deposited recedes from the center point of the one surface 51. As described above, the film thickness in the one surface 51 is uniformized.

Particularly, the film thickness in the x direction is qualitatively uniformized according to the following guidelines. When the moving speed of the shielding member 192 is changed, as in the first embodiment, a speed when the shielding member 192 crosses the central portion of the ejection path 151 is slower than a speed when the shielding member 192 crosses the outer circumferential portion of the ejection path 151. When the effective area of the shielding member 192 is changed, an effective area when the shielding member 192 crosses the central portion of the ejection path 151 is greater than an effective area when the shielding member 192 crosses the outer circumferential portion of the ejection path 151. The effective area of the shielding member 192 can be changed by changing the rotational speed of the shielding member 192. Thus, a time at which shielded is performed by the shielding member 192 can be changed according to a deposition place.

In this embodiment, the film thickness in the x direction can be uniformized using two types of change such as a change in the moving speed of the shielding member 192 and a change in the effective area of the shielding member 192. For example, the film thickness in the x direction can be uniformized even if only the effective area of the shielding member 192 is changed while the moving speed of the shielding member 192 is set to have a constant value.

Hereinafter, a specific example of a method of determining the effective area of the shielding member 192 will be described. Here, variables described in the first embodiment are not described. The following determination method is merely an example, and this embodiment is not limited to the determination method.

Hereinafter, as a parameter describing an effective area, an area ratio $K_X$ is determined by $K_X$=(an effective area of the shielding member 192 in the case of x=X)/(an area in which the ejection path 151 is blocked by the shielding member 192 in the open state). The area ratio $K_X$ indicates an amount by which an effective width in the x direction of the shielding member 192, which blocks the ejection path 151 in the case of x=X [mm], is reduced when compared to that in the open state. This is because a length of the shielding member 192 in the y direction is not changed due to rotation of the plate-like members 192a and 192b.

A speed $V_X$ [mm/s] of the shielding member 192 and the area ratio $K_X$ in the case of x=X [mm] are determined such that a film thickness at a point $P_{X0}$ is uniform with a film thickness at a point $P_{00}$. Since a length of the effective width of the shielding member 192 in the x direction in the case of x=X [mm] is $K_X D_0$ [mm], the length can be approximated as:

$$\Delta T_{X0} = K_X D_0 / V_X.$$

Since the film thickness at the point $P_{X0}$ is equal to the film thickness at the point $P_{00}$, it is satisfied that:

$$R_{X0} \times (T - \Delta T_{X0}) = R_{00} \times (T - \Delta T_{00}).$$

Approximation formulas of $\Delta T_{X0}$ [s] and $\Delta T_{00}$ [s] are substituted into this expression so that the following equation is acquired:

$$R_{X0} \times (T - K_X D_0 / V_X) = R_{00} \times (T - D_0 / V_0).$$

Since $R_{X0}$ and $R_{00}$ are parameters which are each determined by relative positions between the points $P_{X0}$ and $P_{00}$ and the evaporation source 150, $K_X/V_X$ [s/mm] can be determined with respect to T [s], $V_0$ [mm/s], and $D_0$ [mm] which are given. Considering that $0 < R_{X0} < R_{00}$ (refer to FIG. 3A), it is satisfied that $T - K_X D_0 / V_X > T - D_0 / V_0 > 0$. Here, for example, since it is satisfied that $T - K_X D_0 / V_0 > T - D_0 / V_0 > 0$ when $V_X = V_0$ is set, it is satisfied that $K_X < 1$. As qualitatively described above based on the foregoing description, the effective area when the shielding member 192 crosses the central portion of the ejection path 151 is greater than the effective area when the shielding member 192 crosses the outer circumferential portion of the ejection path 151. To be more specific, $K_X$ is given as:

$$K_X = 1 - (R_{00}/R_{X0} - 1) \times (V_0 T / D_0 - 1).$$

As described above, $K_X$ and $V_X$ [mm/s] are determined so that the film thickness in the x direction in the case of y=0 [mm] can be uniformized. Particularly, even if the moving speed of the shielding member 192 is constant ($V_X = V_0$) regardless of an x coordinate, the film thickness can uniformized only by rotating the plate-like members 192a and 192b and changing the effective area of the shielding member 192.

Note that the above-described method of determining the parameters is merely a simple example using approximation. For example, numerical calculation or a simulation may be used so that the parameters can be more precisely determined and the film thickness can also be uniformized. In this case, since $K_X$ is also used as a parameter which can be changed by a design and control in addition to $D_Y$ [mm] and $V_X$ [mm/s] compared to the first embodiment, the film thickness can be more precisely uniformized.

The second embodiment of the present invention has been described above. According to this embodiment, the evaporation apparatus 200 does not include a driving mechanism configured to move the substrate 50 or the evaporation source 150. The evaporation apparatus 200 can be used as long as the evaporation apparatus 200 includes only the driving mechanism 195 configured to move the shielding member 192 and the driving mechanism 196 configured to rotate the shielding member 192. Therefore, the film thickness can be uniformized while apparatus costs incurred to provide the driving mechanism are minimized in accordance with this embodiment.

Also, according to this embodiment, the film thickness can be uniformized by controlling an effective area in addition to a design of the shape of the shielding member 192 and control of the moving speed of the shielding member 192. Thus, the film thickness can be more precisely uniformized. Also, even if the moving speed of the shielding member 192 is constant, the film thickness can be uniformized by controlling the effective area of the shielding member 192.

Note that, in this embodiment, the evaporation source 150 does not necessarily need to completely stop. If the evaporation source 150 is fixed during a period of time in which the film is formed on the substrate, the evaporation source 150 may be moved in other periods. For example, evaporated particles may be evaporated in a form in which the evaporating of the evaporated particles accompanied by transportation of a film thickness correction plate is initially performed on a certain row of the substrate 50, the evaporation source 150 or the substrate 50 is moved after the evaporating for the row has been completed, and the next row of the substrate 50 is evaporated. Thus, with regard to a particularly ultra-large substrate 50, a whole surface of the substrate 50 can be efficiently evaporated by a single evaporation source 150.

In this embodiment, a shape of the evaporation source 150 may differ. Hereinafter, an example of a case in which the shape of the evaporation source 150 differs will be described with reference to FIGS. 7A to 7C and 10A to 10D.

As shown in FIG. 7B, the evaporation source 150 may have the single nozzle 152 of which an opening part extends in the x direction. In this case, with regard to the rate distribution, as shown in FIG. 7A, since the rate distribution is uniform in the x direction, the film thickness does not need to be uniformized in the x direction.

When the rate distribution is uniform in the x direction, the shielding member 191 is moved at a constant speed in the x direction so that the film thickness in the y direction is uniformized as in the first embodiment. On the other hand, in this embodiment, as described above, the film thickness in the y direction can be uniformized only by rotating the shielding member 192 without moving the shielding member 192.

Figure 10A:
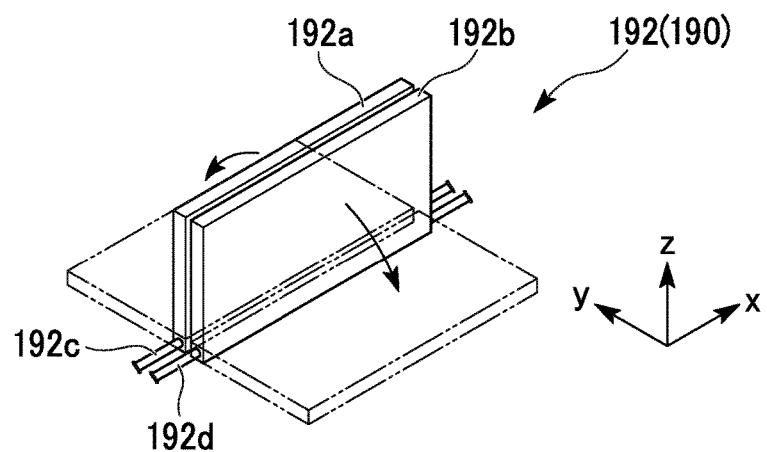
FIG. 10A is a first view for describing a case in which an evaporation source having a different shape is used in the second embodiment.

As shown in FIG. 10A, the shielding member 192 includes two plate-like members 192a and 192b. The plate-like members 192a and 192b have rectangular surfaces. The plate-like members 192a and 192b have the rotating shafts 192c and 192d, which are perpendicular to the x axis, at a position corresponding to one rectangular side. The rotating shafts 192c and 192d are disposed so as to be parallel with each other and to have roughly the same interval therebetween as plate thicknesses of the plate-like members 192a and 192b.

The film thickness is qualitatively uniformized according to the following guidelines. The film thickness is given as a product of each of speeds at which evaporated particles are deposited and an evaporating time. Amounts of rate distributions serving as the speeds at which the evaporated particles are deposited are reduced as the place at which the evaporated particles are deposited recedes from a center point of the one surface 51. Therefore, while the evaporation is performed, an evaporating time is reduced by changing the rotational speed of the shielding member 192 such that a time during which shielding is performed by the shielding member 192 increases as the place at which the evaporated particles are deposited nears the center point of the one surface 51. On the other hand, an evaporating time is increased by changing the rotational speed of the shielding member 192 such that a time during which shielding is performed by the shielding member 192 decreases as the place at which the evaporated particles are deposited recedes from the center point of the one surface 51. As described above, the film thickness in the one surface 51 is uniformized.

Particularly, when the rate distribution is uniform in the x direction, while the evaporation is performed, the shielding member 192 is rotated. Thus, the shielding member 192 is time-changed so that an integration time at which a place to be evaporated is shielded against the evaporation source 150 while the evaporation is performed becomes longer as the shielding member 192 nears a line which passes through the center point of the one surface 51 and is parallel to the x axis.

Figure 10B:
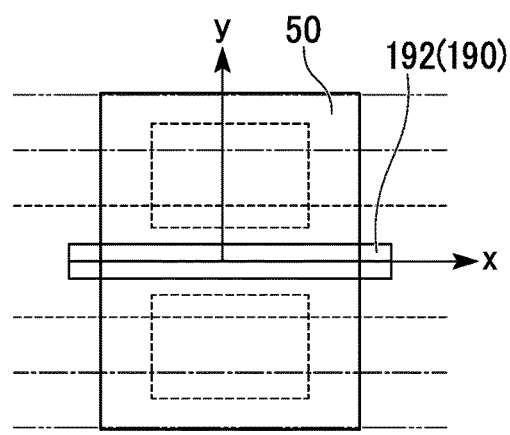
FIG. 10B is a second view for describing a case in which an evaporation source having a different shape is used in the second embodiment.
Figure 10C:
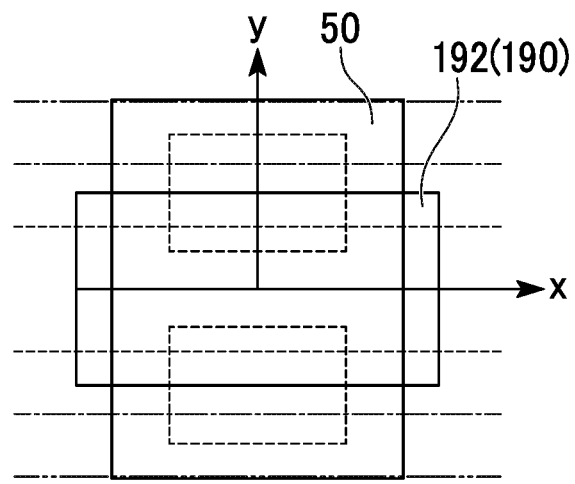
FIG. 10C is a third view for describing a case in which an evaporation source having a different shape is used in the second embodiment.
Figure 10D:
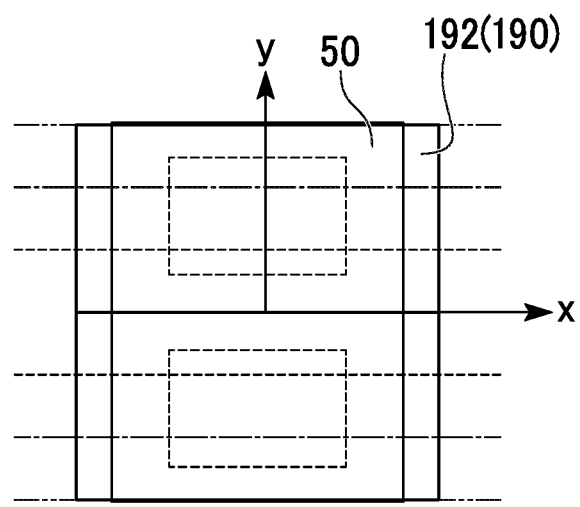
FIG. 10D is a fourth view for describing a case in which an evaporation source having a different shape is used in the second embodiment.

For example, the shielding member 192 is rotated as will be described below. First, as shown in FIG. 10B, when the evaporating starts, the shielding member 192 is set to a closed state so that an effective area thereof is minimized Subsequently, as shown in FIG. 10C, as the evaporated particles are evaporated, the shielding member 192 is rotated so that the effective area thereof is gradually increased. Finally, as shown in FIG. 10D, when the evaporating has been completed, the shielding member 192 is set to an open state so that the effective area thereof is maximized. As described above, the integration time at which the place to be evaporated is shielded against the evaporation source 150 while the evaporated particles are evaporated is longer as the shielding member 192 nears the line which passes through the center point of the one surface 51 and is parallel to the x axis. Thus, the film thickness is uniformized.

As described above, in this embodiment, the film thickness correction means 190 includes the shielding member 192 in which the plate-like members 192a and 192b are rotated about the rotating shafts 192c and 192d which are parallel to the one surface 51 to block a portion of the ejection path 151. Thus, the film thickness can be corrected even without moving the evaporation source 150.

Also, in this embodiment, the rotational speed of the shielding member 192 when the shielding member 192 blocks the central portion of the ejection path 151 is different from the rotational speed of the shielding member 192 when the shielding member 192 blocks the outer circumferential portion of the ejection path 151. Thus, the film thickness can be corrected by changing the effective area for each place in the one surface 51, which is shielded by the shielding member 192.

Also, in this embodiment, the shielding member 192 may be rotated about the rotating shafts 192c and 192d which are parallel to the one surface 51 while being moved across the ejection path 151. Thus, the film thickness can be uniformized even with respect to the rate distribution in which the film thickness cannot be uniformized only by rotating the shielding member 192.

The rotational speed of the shielding member 192 when the shielding member 192 crosses the central portion of the ejection path 151 may be different from the rotational speed of the shielding member 192 when the shielding member 192 crosses the outer circumferential portion of the ejection path 151. Thus, a time during which each place in the one surface 51 is shielded by the shielding member 192 is changed by changing both of the effective area shielded by the shielding member 192 and the rotational speed of the shielding member 192 so that the film thickness can be corrected.

Third Embodiment

Hereinafter, a third embodiment of the present invention will be described with reference to FIGS. 2, 7A to 7C, and 11A to 11D.

Figure 11A:
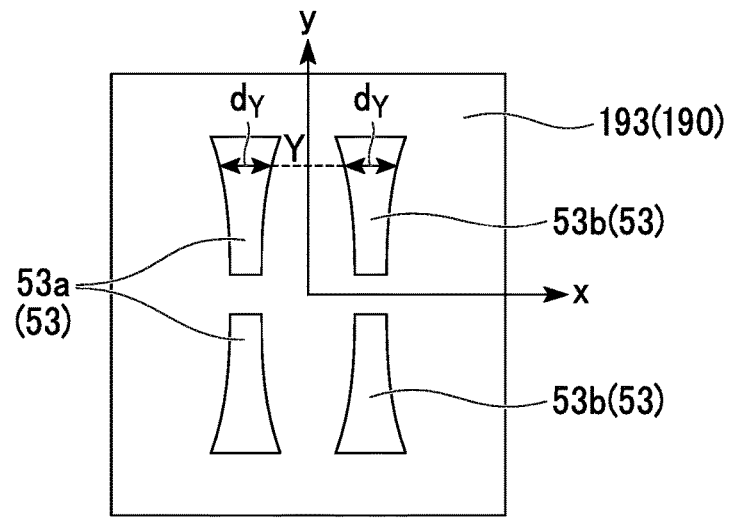
FIG. 11A is a first view for describing a schematic structure and an operation of a shielding member in a third embodiment.

As shown in FIG. 11A, in this embodiment, a shielding member 193 has a shape in which a plurality of opening parts 53a and 53b are provided in one plate-like member. In this respect, the third embodiment is significantly different from the second embodiment and the first embodiment.

In this embodiment, as shown in FIG. 7B, an evaporation source 150 has a nozzle 152 which extends in the x direction. As shown in FIG. 7A, a rate distribution is uniform in the x direction. In this case, an evaporating time is changed at points on a substrate 50 so that a film thickness is uniformized.

Since the film thickness is uniformized in the y direction, in this embodiment, as shown in FIG. 11A, one plate-like member having a plurality of opening parts 53 is used as the shielding member 193. In the drawing, the opening parts 53 have two rows of opening parts 53a and 53b in the y direction to correspond to places 52a and 52b, which are formed with deposition films, that is, the opening part 121 (refer to FIG. 2) of the evaporation mask 120. Naturally, the number of opening parts 53 is not limited thereto, and a number according to the number of places at which deposition films are formed may be disposed. The shielding member 193 is moved, for example, at a constant speed in the x direction.

As a y coordinate increases, each of the opening parts 53 is provided such that a width thereof is increased. To be specific, if a point $P_{XY}$ is set as a point of x=X [mm] and y=Y [mm], an amount of a rate distribution in the case of y=Y is $R_Y$ [μm/s], and an evaporating time is set as $\tau_Y$ [s], when a film thickness is uniformized, it is satisfied that $R_Y \times \tau_Y = \lambda$ [μm]. Here, λ is the film thickness. An evaporating time at the point $P_{XY}$ is equal to a time at which the opening parts 53 of the shielding member 193 passes through a portion which is just below the point $P_{XY}$. Therefore, if a moving speed of the shielding member 193 is set as $V_0$ [mm/s], a width $d_Y$ [mm] of the opening parts 53 in the case of y=Y [mm] is given as $d_Y = V_0 \times \tau_Y = \lambda/R_Y$. In other words, the width of the opening parts 53 of the shielding member 193 may be determined to be inversely proportional to an amount (refer to FIG. 7A) of a rate distribution in the case of y=Y [mm].

Figure 11B:
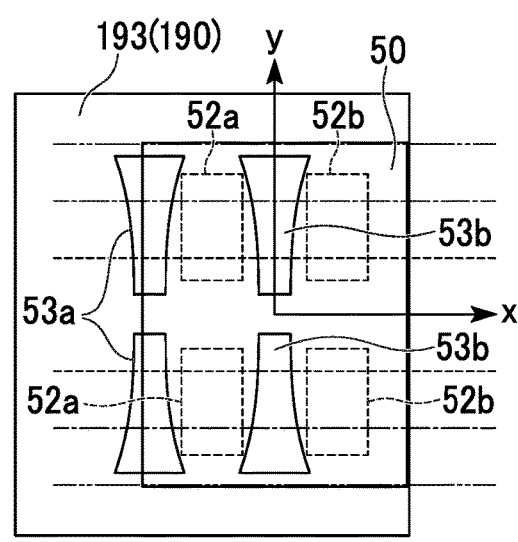
FIG. 11B is a second view for describing the schematic structure and the operation of the shielding member in the third embodiment.
Figure 11C:
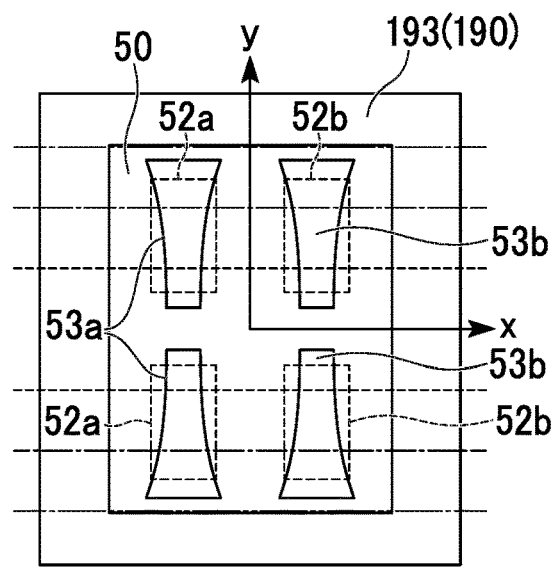
FIG. 11C is a third view for describing the schematic structure and the operation of the shielding member in the third embodiment.

A method of moving the shielding member 193 will be described with reference to FIGS. 11B to 11D. First, as shown in FIG. 11B, the shielding member 193 is set such that the opening parts 53a and 53b are located at a negative side in the x direction in consideration of the places 52a and 52b in a surface of the substrate 50, at which the deposition films are formed. At that time, since the substrate 50 is shielded against the evaporation source 150, the evaporating does not start. In other words, the shielding member 193 also plays a role of a function of a shutter.

Subsequently, the shielding member 193 is moved in the x direction. As shown in FIG. 11C, while the opening parts 53a and 53b of the shielding member 193 and the opening part 121 (refer to FIG. 2) of the evaporation mask 120 overlap each other, the substrate 50 is open to the evaporation source 150. As a result, the one surface 51 (refer to FIG. 2) of the substrate 50 is supplied with evaporated particles via the opening part 121 of the evaporation mask 120 and the opening parts 53a and 53b of the shielding member 193. As described above, widths of the opening parts 53a and 53b are determined to be inversely proportional to the rate distribution so that film thicknesses of deposition films formed at places 52a and 52b are uniformized in the y direction.

Figure 11D:
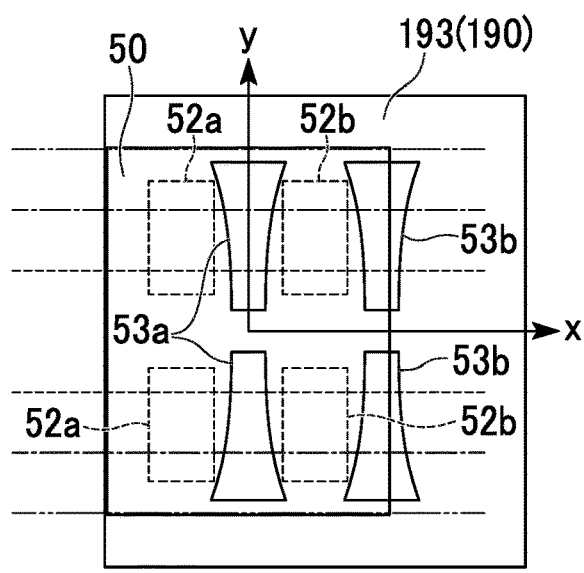
FIG. 11D is a fourth view for describing the schematic structure and the operation of the shielding member in the third embodiment.

As shown in FIG. 11D, the moving of the shielding member 193 finishes at a time at which the opening parts 53a and 53b of the shielding member 193 and the places 52a and 52b at which the deposition films are formed no longer overlap. At that time, since the substrate 50 is shielded against the evaporation source 150, the evaporating ends. In other words, the shielding member 193 also plays the role of a function of a shutter.

As described above, according to this embodiment, the shielding member 193 in which the widths of the opening parts 53a and 53b are determined to be inversely proportional to the rate distribution is used so that the film thickness is uniformized in the y direction even without moving the evaporation source 150. Also, since the shielding member 193 also plays the role of a function of a shutter, a separate shutter does not need to be provided. When the shielding member 193 is moved, the opening parts 53 of the shielding member 193 can be used as long as the opening parts 53 thereof are moved over a distance by which the opening parts 53 pass the corresponding opening parts 121 of the evaporation mask 120. For this reason, the shielding member 191 does not need to be moved over a long distance as in the first embodiment. As described above, this embodiment includes a simple driving mechanism which does not include the driving mechanism of the evaporation source 150 and moves the shielding member. As a result, apparatus costs can be reduced.

Preferred embodiments related to the present invention have been described above with reference to the accompanying drawings, but the present invention is not limited thereto. The shapes, the combinations, and the like of the constitution elements illustrated in the above-described examples are examples, and can be variously changed on the basis of design requirements without departing from the gist of the present invention.

INDUSTRIAL APPLICABILITY

Some aspects of the present invention can be applied to an evaporation apparatus, an evaporation method, and the like in which a film thickness of a deposition film needs to be uniformized using a simple driving mechanism.

DESCRIPTION OF THE REFERENCE SYMBOLS

100 Evaporation apparatus
110 Substrate holding section
120 Evaporation mask
121 Opening part of evaporation mask
150 Evaporation source
151 Ejection path
190 Film thickness correction means
191, 192, 193 Shielding member
192c, 192d Rotating shaft
50 Substrate
51 One surface
53 Opening part of shielding member

The invention claimed is:

1. An evaporation apparatus comprising:
a substrate holding section configured to hold a substrate;
an evaporation mask including an opening part at a position which is opposite to one surface of the substrate;
an evaporation source configured to supply the one surface with evaporated particles via the opening part and to form a film of the evaporated particles on the one surface exposed from the opening part; and
a film thickness correction structure including two plate-shaped members which respectively rotate in opposite directions on two shafts which are parallel to the one surface, the film thickness correction structure blocks a portion of an ejection path of the evaporated particles from the evaporation source toward the opening part and corrects a thickness of the film by changing a position at which the ejection path is blocked over time, wherein
the film thickness correction structure is controlled such that the closer a position of the one surface is to an edge of the substrate, the less the film thickness correction structure blocks the evaporated particles that contact the position of the one surface.

2. The evaporation apparatus according to claim 1, wherein the two plate-shaped members of the film thickness correction structure are configured to be moved across the ejection path.

3. The evaporation apparatus according to claim 2, wherein the evaporation source comprises a nozzle of which an opening part extends in one direction, and
the two plate-shaped members are moved at a constant speed in the one direction.

4. The evaporation apparatus according to claim 1, wherein the two shafts are parallel to the one surface to block a portion of the ejection path,
the two plate-shaped members have a semi-circular surface, and
the semi-circular surfaces include respective ones of the two shafts at a position corresponding to a diameter of the semi-circular surface.

5. The evaporation apparatus according to claim 4, wherein a first rotational speed of the two plate-shaped members when the two plate-shaped members block a central portion of the ejection path is different from a second rotational speed of the two plate-shaped members when the two plate-shaped members block an outer circumferential portion of the ejection path, and a first effective area in a direction vertical to the substrate when the two plate-shaped members cross the central portion is greater than a second effective area in the direction when the two plate-shaped members cross the outer circumferential portion.

6. The evaporation apparatus according to claim 4, wherein the two plate-shaped members are rotated about the two shafts which are parallel to the one surface while moving across the ejection path.

7. An evaporation method using the evaporation apparatus of claim 1, the evaporation method comprising:
- blocking, while evaporation is performed, by the film thickness correction structure, the portion of the ejection path of the evaporated particles from the evaporation source toward the opening part, and correcting the thickness of the film by changing the position, at which the ejection path is blocked, by the film thickness correction structure over time, and
- controlling so that more the position in the one surface approaches an edge of the substrate, more the blocking of the evaporated particles is reduced.

8. The evaporation method according to claim 7, wherein the two plate-shaped members of the film thickness correction structure are configured to be moved across the ejection path.

* * * * *